United States Patent
Hadjichristos et al.

(10) Patent No.: US 6,785,521 B2
(45) Date of Patent: Aug. 31, 2004

(54) SYSTEM AND METHOD FOR CURRENT-MODE AMPLITUDE MODULATION

(75) Inventors: Aristotele Hadjichristos, Apex, NC (US); David R. Pehlke, Chapel Hill, NC (US)

(73) Assignee: Ericsson Inc., Research Triangle Park, NC (US)

( * ) Notice: Subject to any disclaimer, the term of this patent is extended or adjusted under 35 U.S.C. 154(b) by 545 days.

(21) Appl. No.: 09/813,593

(22) Filed: Mar. 21, 2001

(65) Prior Publication Data

US 2002/0137480 A1 Sep. 26, 2002

(51) Int. Cl.[7] .................................................. H03C 1/52
(52) U.S. Cl. ..................... 455/108; 455/126; 455/127.2
(58) Field of Search .............................. 455/127.1, 110, 455/73, 126, 127.2, 127.3, 68, 71, 108, 109, 232.1, 343.1, 525; 325/295–298, 300, 301; 330/10, 136, 296

(56) References Cited

U.S. PATENT DOCUMENTS

| | | | |
|---|---|---|---|
| 3,211,989 A | | 10/1965 | Mintz et al. |
| 3,895,316 A | | 7/1975 | Fein |
| 4,085,389 A | * | 4/1978 | Kuroda et al. ............... 332/159 |
| 4,247,948 A | * | 1/1981 | Okada et al. ............... 455/116 |
| 4,492,926 A | * | 1/1985 | Kusakabe et al. .......... 329/349 |
| 4,510,460 A | | 4/1985 | Tamura |
| 4,525,686 A | * | 6/1985 | Yokoya ........................ 331/17 |
| 5,126,683 A | * | 6/1992 | Ishikawa et al. ............. 329/369 |
| 5,136,300 A | | 8/1992 | Clarke et al. |
| 5,497,125 A | | 3/1996 | Royds |
| 5,828,205 A | | 10/1998 | Byrne |
| 5,872,481 A | | 2/1999 | Camarillo et al. |
| 5,966,051 A | * | 10/1999 | Griffith et al. ............... 330/285 |
| 6,025,754 A | | 2/2000 | Czora |
| 6,356,154 B1 | * | 3/2002 | Hallen ........................ 330/254 |
| 2001/0014593 A1 | * | 8/2001 | McCune ..................... 455/127 |

FOREIGN PATENT DOCUMENTS

| | | |
|---|---|---|
| EP | 0558793 | 9/1993 |
| EP | 0772292 | 5/1997 |
| EP | 0887924 | 12/1998 |
| FR | 2766637 | 1/1999 |
| WO | WO48307 | 8/2000 |

OTHER PUBLICATIONS

U.S. patent application No. 09/738,971; Pehlke et al.; filed Dec. 14, 2000; Title: System and Method of RF Power Amplification.

U.S. patent application No. 09/813,741; Pehlke et al.; filed Mar. 21, 2001; Title: System and Method for RF Signal Amplification.

* cited by examiner

Primary Examiner—Pablo N. Tran
(74) Attorney, Agent, or Firm—Coats & Bennett, P.L.L.C.

(57) ABSTRACT

An amplifier circuit includes a power amplifier biased for saturated mode operation, and a controllable current source to provide supply current to the power amplifier. The controllable current source effects desired amplitude modulation of the output signal from the power amplifier by modulating the supply current it provides responsive to an amplitude information signal.

59 Claims, 11 Drawing Sheets

SYSTEM AND METHOD FOR CURRENT-MODE AMPLITUDE MODULATION

BACKGROUND OF THE INVENTION

The present invention generally relates to RF power amplifiers and, in particular, relates to efficient, linear RF signal amplification.

Several existing wireless communication standards are either in use, or planned for use in the near future. Current standards that enjoy varying degrees of deployment globally include the TIA/EIA-136 and Global Services for Mobile Communications (GSM) standards, which represent competing approaches for providing wireless communication and data services. The TIA/EIA-136 and GSM standards employ Time Division Multiple Access (TDMA) techniques. Other deployed standards, based on Code Division Multiple Access techniques, include the IS-95 standard. Newer standards, including those still in development, or enjoying initial roll out, include the so-called third generation (3G) standards. The 3G standards include the North American CDMA-based IS-2000, and the primarily European Wideband CDMA (WCDMA) standards. The Enhanced Data Rates for Global Evolution (EDGE) standards provide a migration path for TDMA and GSM networks towards 3G services.

Differing approaches to transmit signal modulation exist among the various standards, but each standard typically has specifications regarding transmit signal fidelity. The spectral requirements, such as spectral purity or adjacent channel power, impose certain performance requirements on the RF transmitters used within systems based on these standards. In some cases, the spectral requirements imposed by certain of these standards are quite rigorous. For example, the EDGE extensions to GSM and TDMA standards move away from the Gaussian Minimum Shift Keying in favor of 8-PSK modulation, which has significant spectral purity requirements. Such requirements place significant linearity demands on the associated transmitters.

BRIEF SUMMARY OF THE INVENTION

The present invention includes a system and method for efficient, linear RF signal amplification. A power amplifier biased for saturated mode operation is powered by a controllable current source. Amplitude modulation of the output signal from the power amplifier is based on controlling its supply current in proportion to an envelope modulation signal. In this manner, the power amplifier may be configured for efficient operation in a saturated mode, while still being used to generate a transmit signal with highly linear envelope modulation. Supply current modulation provides good linearity of control across a broad range of power amplifier operating currents, and may be particularly advantageous for certain types of power amplifier devices, such as heterojunction bipolar transistor (HBT) power amplifiers.

One approach to RF transmit signal generation involves the generation of separate baseband phase and amplitude information signals. The constant envelope phase information signal may then be used to generate a phase-modulated output signal, which is then amplified by the HBT PA. In conjunction, the amplitude information signal is used to drive a lossy modulator that modulates the supply current of the HBT PA responsive to the desired amplitude information. This action modulates the envelope of the transmit signal output by the HBT PA as a function of the desired amplitude information.

The lossy modulator typically comprises a control amplifier, a pass element, and a feedback circuit. These elements together form a closed-loop control circuit that locks the power amplifier's supply current to an amplitude modulation signal. Generally, the feedback circuit comprises a low-resistance element disposed in the power amplifier's supply current path to sense power amplifier current, while minimizing dissipative power losses. The pass element may be realized in a variety of ways, with an exemplary implementation based on a FET device, having a gate voltage controlled by the control amplifier as a function of the difference between the feedback and input modulation signals.

DETAILED DESCRIPTION OF THE INVENTION

While the present invention contemplates usage within mobile terminals or other battery-powered RF communication devices where power amplifier efficiency and linearity are critical, it is applicable to a broad range of RF applications. It should further be noted that the present invention is related to the co-pending application entitled, "System and Method of RF Power Amplification," which is commonly assigned with the instant application. The disclosure of that co-pending application is incorporated herein by reference.

Figure 1:
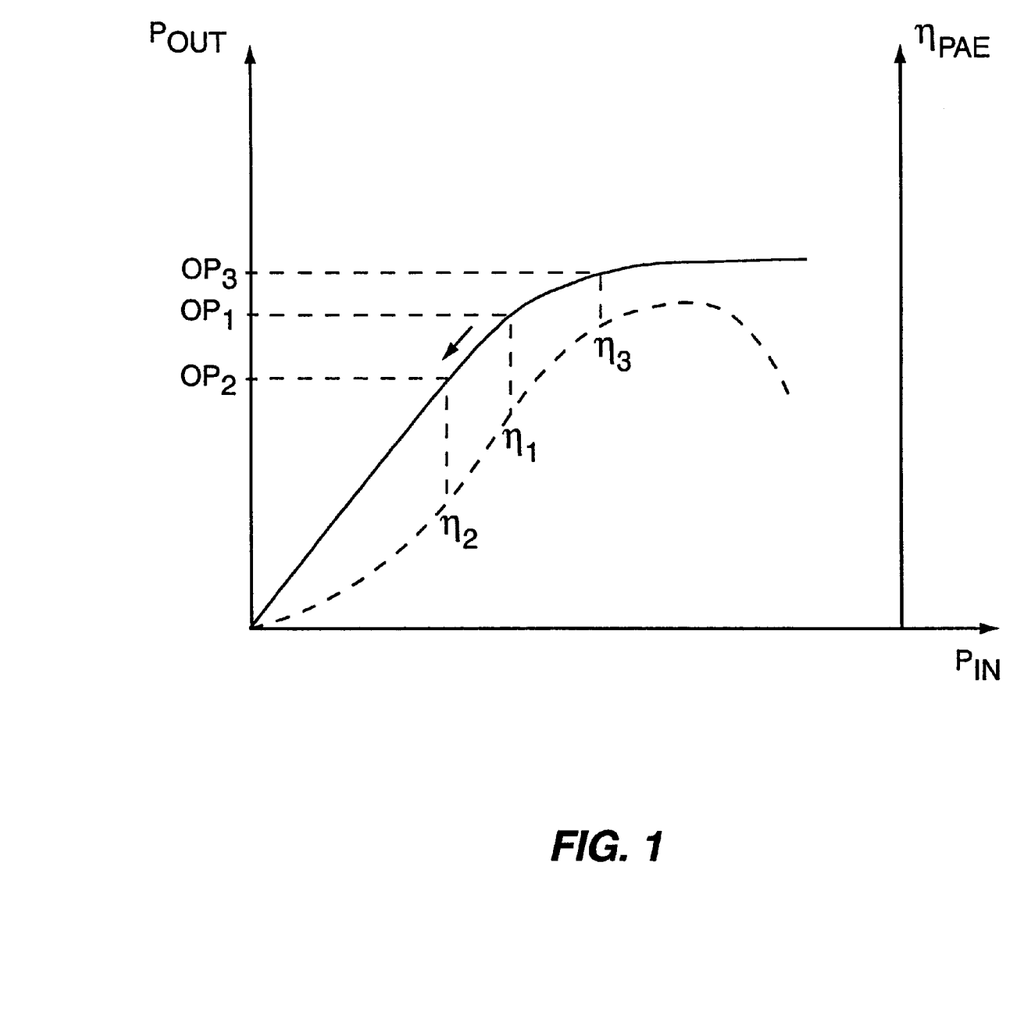
FIG. 1 is a diagram of a general power amplifier efficiency curve in relation to input and output signal power.

FIG. 1 depicts a general radio frequency output power curve for a typical power amplifier, and additionally illustrates the general relationship between the amplifier's operating point and its operating efficiency. The horizontal axis represents the RF power of the input signal $RF_{IN}$, while the left vertical axis represents the RF power of the output signal $RF_{OUT}$ generated by a radio frequency power amplifier, and the right vertical axis represents power amplifier operating efficiency ($\eta_{PAE}$). Operating point 1 ($OP_1$) on the $P_{OUT}$ vertical axis illustrates a nominal operating point that might be chosen for linear operation of the power amplifier.

$OP_1$ corresponds to an amplifier operating efficiency $\eta_1$ in linear mode operation, which may have an exemplary value in the neighborhood of forty percent. The linearity requirements of some modulation standards, such as the 8-PSK techniques used in EDGE mobile terminals, are such that $OP_1$ may significantly degrade the spectral quality at the power amplifier output. Because of this, the power amplifier may be configured for operation at operating point 2 ($OP_2$), which provides greater range for linear amplification but results in significantly poorer efficiency. An exemplary efficiency value for $OP_2$ might be in the range of thirty percent.

Operating point 3 ($OP_3$) offers significantly improved efficiency as compared to $OP_1$ and $OP_2$, but requires that the power amplifier operate in a saturated mode, where the RF output power no longer varies linearly with the RF input power. As earlier noted, some signal modulation schemes do not require linear amplification, so operation at $OP_3$ presents no problems with regard to such signal modulation schemes. However, signal modulation schemes that require linear amplification are not amenable to amplification with conventional power amplifiers operating in saturated mode.

Figure 2:
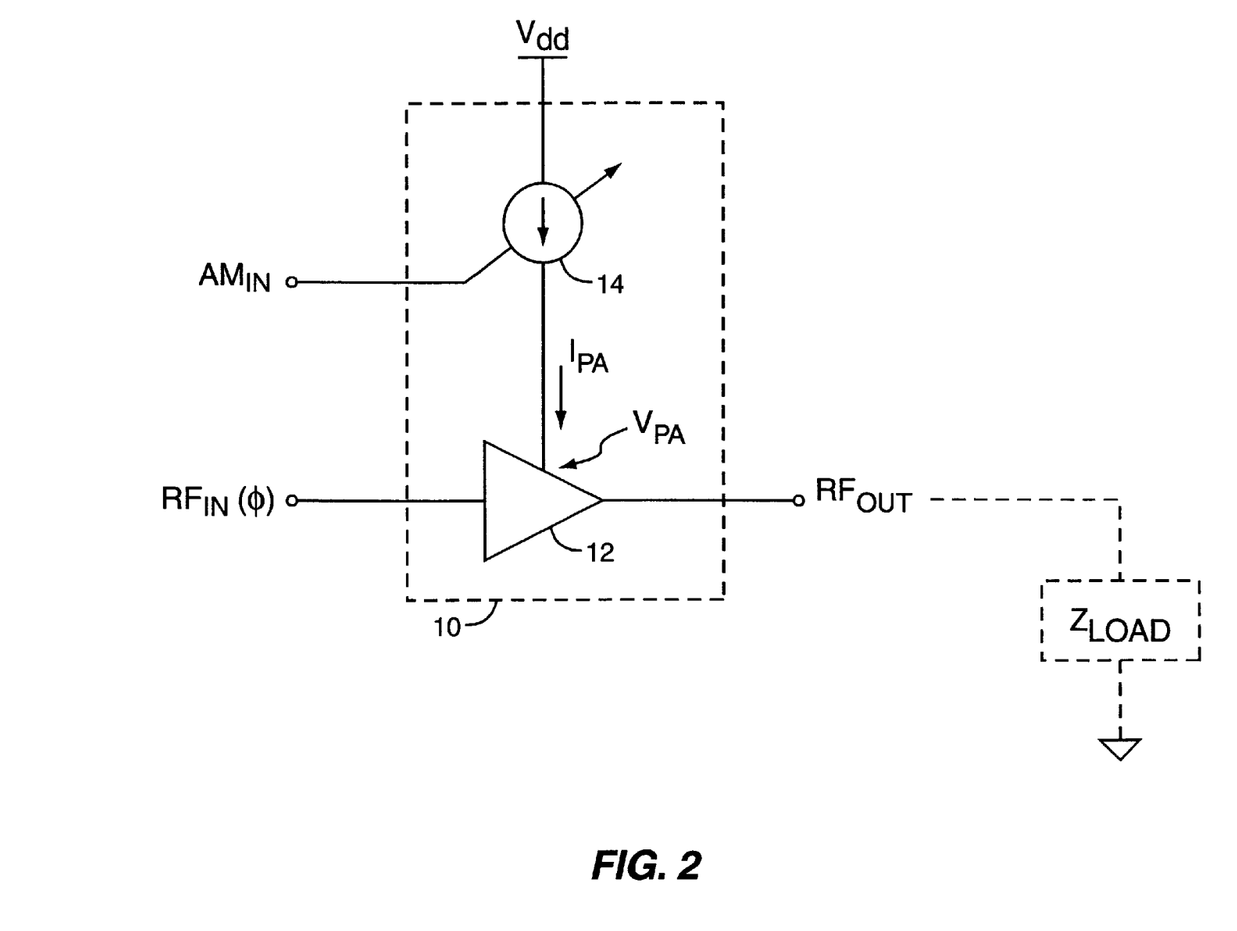
FIG. 2 is a diagram of the general amplifier circuit of the present invention.

FIG. 2 is an exemplary diagram of an amplifier circuit 10 in accordance with the present invention. The amplifier circuit 10 includes a power amplifier 12, and a lossy modulator 14. The term "lossy" applies because the lossy modulator 14 dissipates power during operation. However, in contrast to the lossy modulator of the earlier incorporated and co-pending application, the lossy modulator 14 of the present invention controls the supply current $I_{PA}$ provided to the power amplifier 12 as a function of the desired amplitude modulation information. That is, the lossy modulator 14 operates directly on the supply current of the power amplifier 12. This operation is independent of the applied voltage $V_{PA}$ within the limits of the voltage ceiling defined by the supply voltage $V_{dd}$. Thus, the lossy modulator 14 operates as a controllable current source and, for clarity, is referred to herein as the current source 14.

The power amplifier 12 may itself be a compound or multi-amplifier arrangement, and is configured for saturated mode operation. While not shown, the power amplifier 12 may include filtering circuitry between its supply input and the corresponding current source 14. Essentially, this filtering circuitry would suppress any RF frequencies present on its supply input and may simply comprise a shunt capacitor and/or RF choke. Note that the output capacitance of the current source 14 may itself effectively suppress unwanted RF frequencies on the supply input of the power amplifier 12, and obviate the need for supplemental filtering.

The power amplifier 12 receives a constant-envelope RF input signal, $RF_{IN}$, which it amplifies to produce the transmit signal, $RF_{OUT}$. The current source 14 imparts desired amplitude modulation to the otherwise constant-envelope transmit signal $RF_{OUT}$ by modulating the supply current used to power the power amplifier 12 in accordance with an amplitude information signal $AM_{IN}$. The amplitude information signal $AM_{IN}$ corresponds to the amplitude modulation desired for the transmit signal $RF_{OUT}$.

Commonly, the transmit signal $RF_{OUT}$ conveys desired information based on a combination of synchronized phase and amplitude modulation of the transmit signal. Thus, the input signal $RF_{IN}$ might be a constant-envelope phase-modulated signal, with the amplitude information signal $AM_{IN}$ being a corresponding, synchronized amplitude modulation signal. General methods for creating such signals are discussed later when the amplifier circuit 10 is presented in the context of a larger system, such as a mobile terminal.

Because the RF input signal $RF_{IN}$ is a constant-envelope signal, the power amplifier 12 is not required to respond to linear amplitude variations on its signal input. However, the supply current modulation provided by the current source 14 provides a way to impart very linear envelope modulation onto the transmit signal $RF_{OUT}$, despite operating the power amplifier 12 in a saturated mode. Because the current source 14 directly controls the supply current $I_{PA}$ it provides independent of supply voltage $V_{PA}$, changes in output loading, shown as $Z_{LOAD}$, of the power amplifier 12 do not change the supply current $I_{PA}$. Such changes in output loading might result from, for example, coupling changes from an antenna (not shown) connected to the power amplifier's output.

Operating the power amplifier 12 in this manner has significant advantages. Other techniques, such as controlling the supply voltage $V_{PA}$ of the power amplifier 12 may work well for certain types of power amplifiers 12, yet result in non-linearity of control for other amplifier types. As an example, certain types of field-effect transistor (FET) power amplifiers 12 afford reasonably linear control over a wide output power range or amplitude modulation range of the transmit signal $RF_{OUT}$. However, heterojunction bipolar transistor (HBT) power amplifiers 12 do not respond linearly under supply voltage modulation control, particularly at lower amplitudes of the transmit signal $RF_{OUT}$.

Figure 3:
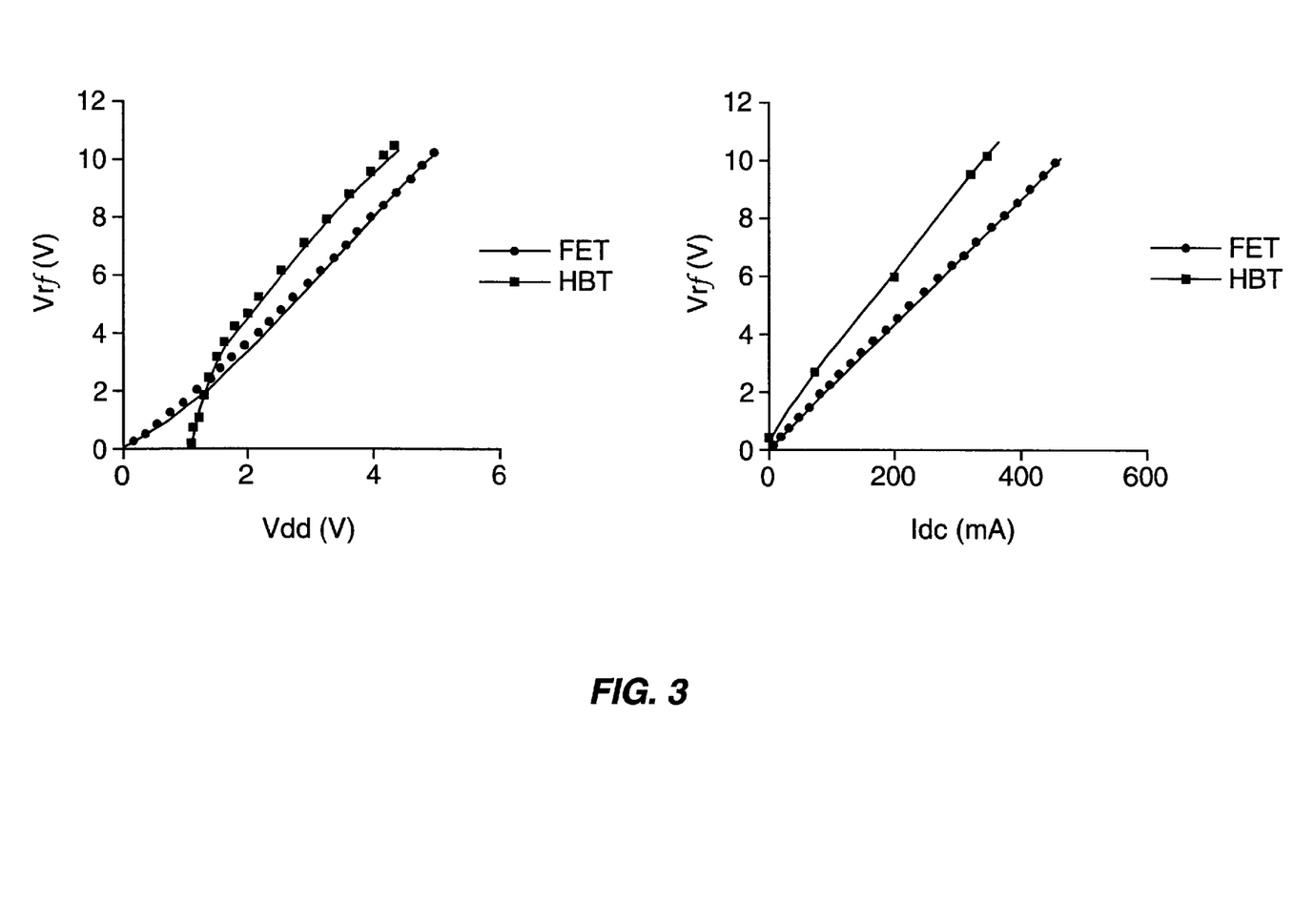
FIG. 3 is a diagram contrasting supply voltage control with supply current control, for both field-effect transistor (FET) and heterojunction bipolar transistor (HBT) power amplifier devices.

FIG. 3 contrasts supply voltage modulation with supply current modulation, in terms of saturated amplifier output linearity. The left graph plots the amplitude of $RF_{OUT}$ as a function of controlling the supply voltage $V_{PA}$ applied to the supply input of the power amplifier 12, for both FET and HBT implementations of the power amplifier 12. As shown, the FET implementation exhibits reasonably good linearity over the control range of supply voltage. However, the HBT implementation exhibits substantial non-linearity at the lower operating voltages.

The right graph illustrates the same FET and HBT implementations for the power amplifier 12, but plots $RF_{OUT}$ amplitude as a function of supply current control as may be implemented using the current source 14. As shown, the linearity of the FET implementation is improved somewhat, but the linearity of the HBT implementation enjoys dramatic improvement.

Figure 4:
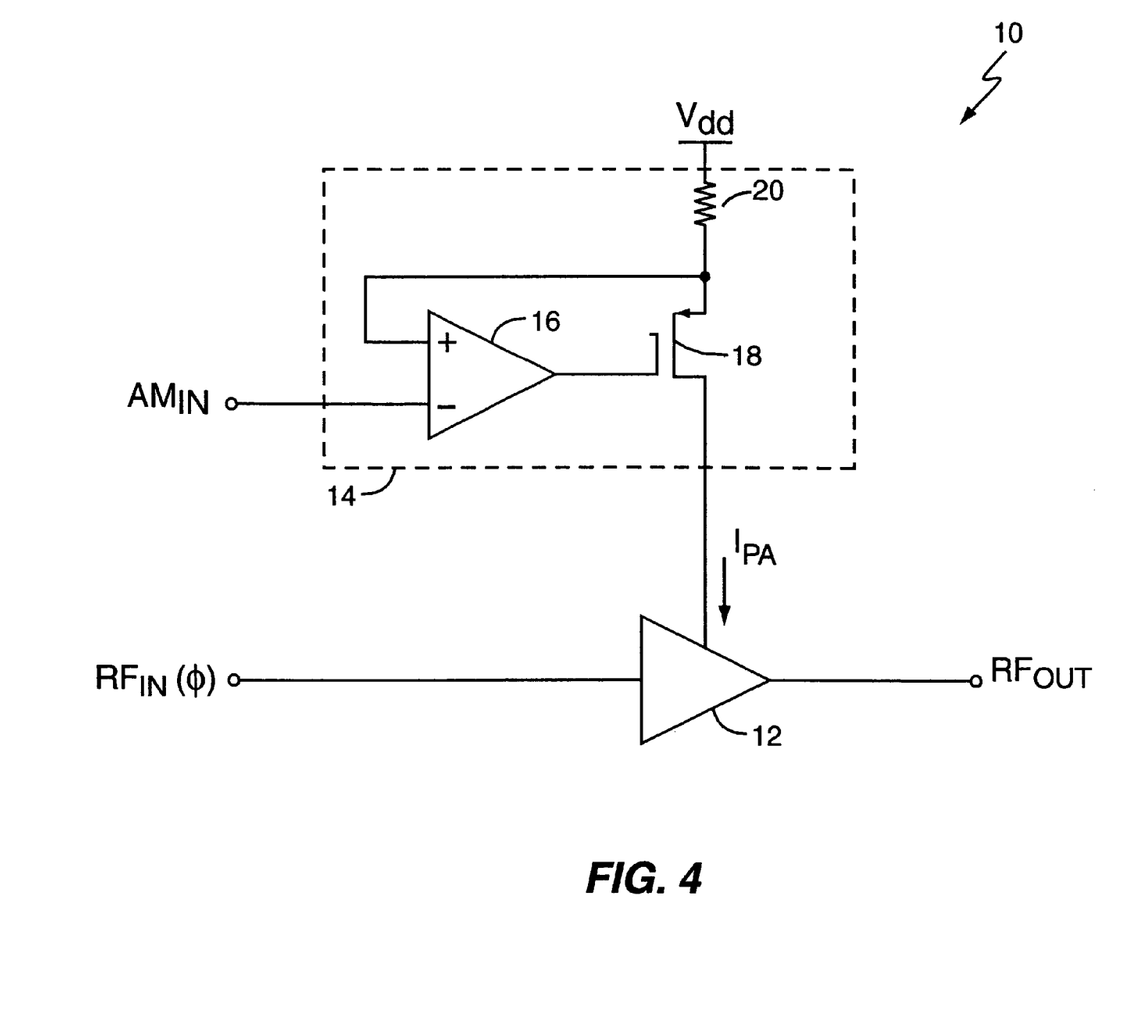
FIG. 4 is a diagram of an exemplary implementation of the amplifier circuit of FIG. 2.

FIG. 4 is a diagram of an exemplary implementation of the current source 14. The current source 14 comprises a control amplifier 16, a pass transistor 18, and a sense resistor 20. In this configuration, the current source 14 is realized as a closed-loop control circuit linearly responsive to a voltage-mode amplitude information signal $AM_{IN}$. The current source 14 controls the magnitude of the supply current $I_{PA}$ it provides to the power amplifier 12 as a function of the amplitude information signal $AM_{IN}$.

In operation, the $AM_{IN}$ signal is generated as, or converted to, a voltage-mode signal applied to the non-inverting input of the control amplifier 16, which may, for example, be an operational amplifier. The control amplifier 16 generates a control voltage based on the difference between the $AM_{IN}$ signal and a feedback signal taken from the supply current path of the power amplifier 12. The control voltage sets the gate bias for the pass transistor 16, which in turn sets the magnitude of the supply current $I_{PA}$ provided to the power amplifier 12.

The feedback signal is, in this implementation, developed as a function of the voltage drop across the sense resistor 20, which is disposed in series with the pass transistor 18 in the supply current path. The voltage drop across the sense resistor 20 is a direct function of the supply current $I_{PA}$ into the power amplifier 12. Thus, the $AM_{IN}$ signal controls the current source 14 such that it provides a supply current $I_{PA}$ to the power amplifier 12 that is modulated in accordance with signal variations in the $AM_{IN}$ signal.

The sense resistor 20 is generally chosen to have the lowest possible resistance that still yields workable feedback signal levels. The motivation for choosing relatively small resistance values for the sense resistor 20 arises from the desire to limit the amount of power dissipated by sensing supply current $I_{PA}$. However, in practice the desire for efficient current sensing balances against the need to develop adequate feedback signal levels at the control amplifier 16. An exemplary value of feedback resistor is in the range of 100 mΩ, but the particular value chosen in a given implementation depends on the expected magnitude range of the supply current $I_{PA}$, the gain versus frequency characteristics of the control amplifier 16, and the expected bandwidth of the amplitude information signal $AM_{IN}$.

The gain characteristics of the control amplifier 16 are a factor because it should be able to accurately generate the control voltage for the pass transistor 18 across the full bandwidth of the $AM_{IN}$ signal, even at the lowest levels of the feedback signal taken from the sense resistor 20. In a given implementation of the current source 14, the control amplifier 16 may be chosen based on the above identified factors, allowing an informed design comprise between cost and performance.

Figure 5:
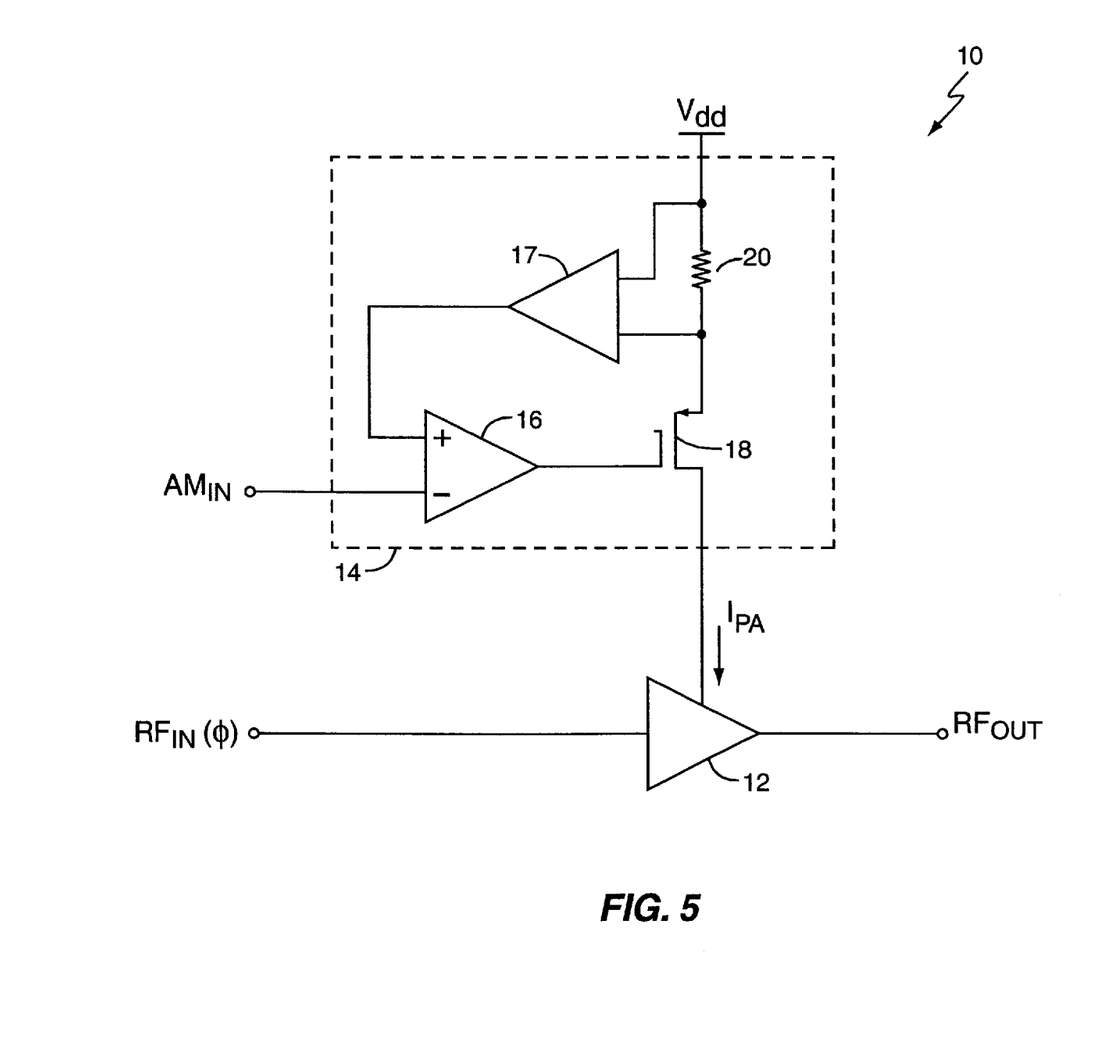
FIG. 5 is a diagram of an alternate exemplary implementation of the circuit of FIG. 4.

It may be that higher performance amplifier devices with high unity gain bandwidth provide acceptable performance for use as the control amplifier 16 within certain bandwidth limitations on the signal $AM_{IN}$. Cost considerations, as noted above, provide incentive for minimizing the performance requirements the control amplifier 16 and FIG. 5 illustrates one approach to reducing such requirements. A second amplifier 17 provides additional gain in the feedback loop of the control amplifier 16. By amplifying the differential signal taken across the sense resistor 20, amplifier 17 provides the control amplifier 16 with a larger control signal, which minimizes its gain requirements. That is, the feedback signal gain provided by amplifier 17 reduces the closed loop gain requirements of the control amplifier 16. This approach reduces the bandwidth requirements of both amplifiers 16 and 17.

Figure 6:
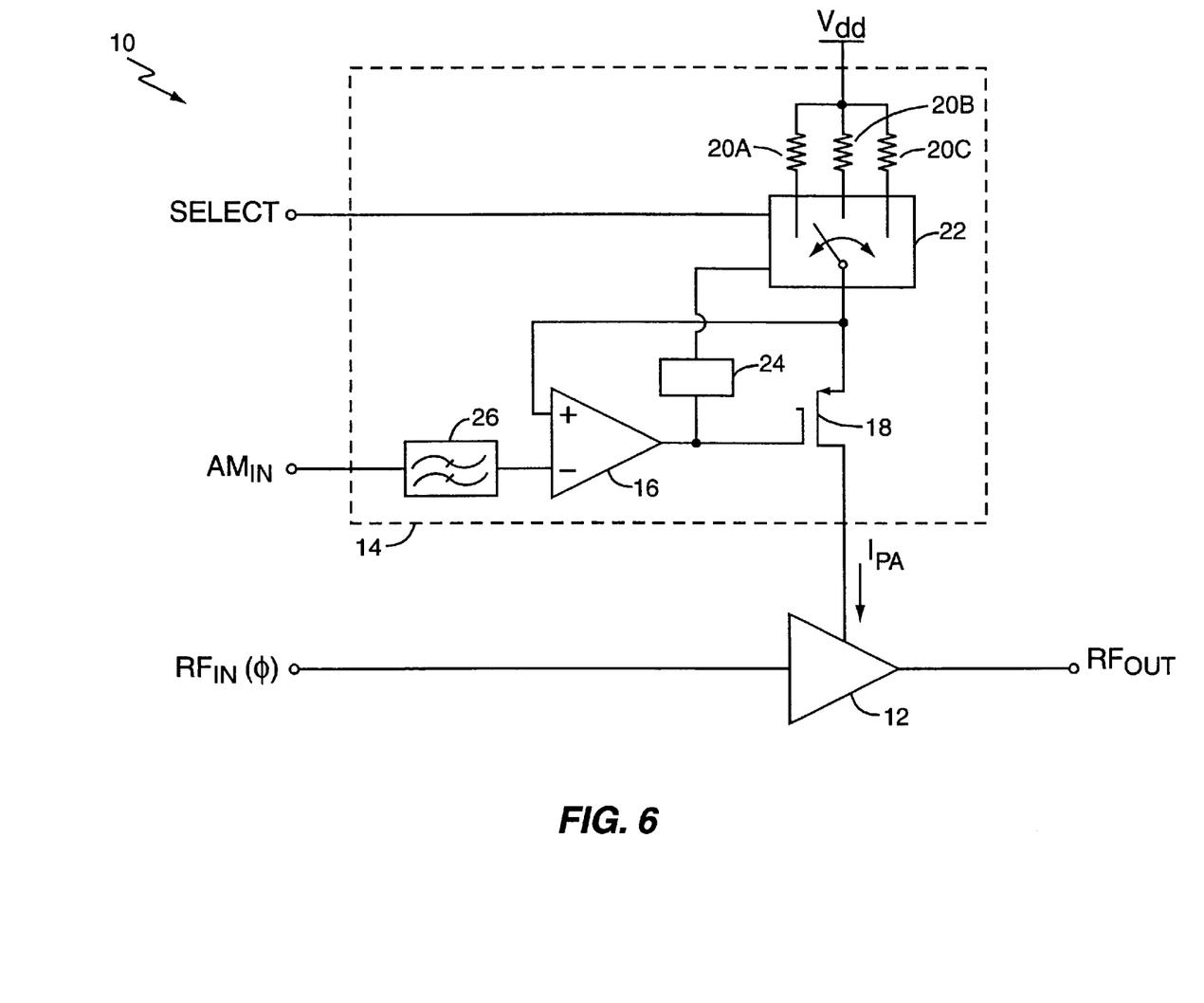
FIG. 6 is a diagram of the amplifier circuit of FIG. 4 with various, optional additions.

Besides enhancing the design in light of signal bandwidth considerations, other variations on the current source 14 of FIG. 4 or 5 incorporate additional operating features that may selectively added as needed or desired. FIG. 6 illustrates some of these optional features, including a plurality of sense resistors 20A . . . 20C, a corresponding sense resistor selection switch 22, optional selection signal logic 24, and an input filter 26.

As earlier noted, the sense resistor 20 provides the feedback signal based on developing a voltage drop proportional to the supply current $I_{PA}$. Reducing its resistance to a minimum value reduces the power lost in the sense resistor 20. Too small a resistance value will, however, yield undesirably low signal levels at the lower ranges of the supply current $I_{PA}$. One approach that satisfies these competing concerns is based on using a selected value sense resistor, e.g., 20A, 20B, or 20C, only within a given operating range of the supply current $I_{PA}$.

The sense resistor 20A may be made relatively large to insure good feedback signal levels at low magnitudes of supply current $I_{PA}$. Once the supply current $I_{PA}$ moves into a second magnitude range, the switch 22 may be made to change to sense resistor 20B, which may be scaled smaller in value with respect to the sense resistor 20A. Similarly, switch 22 may be used to select the sense resistor 20C, which can be made smaller still, once the supply current $I_{PA}$ moves into a third, perhaps maximum range. Of course, a smaller or greater number of sense resistors 20, with varying schemes for relative sizing of impedance values, may be used as needed.

An external selection signal may be used to control the switch 22 to selectively connect one of the set of sense resistors 20 into the supply current path. Such a signal might be generated by external logic. Logic generating the selection signal might be coordinated with known transmit power ranges. Alternatively, the current source 14 may incorporate a selection control circuit 24. The selection control circuit 24 could be configured, for example, as a simple magnitude comparison circuit, that generates a selection signal based on control voltage generated by the control amplifier 16. Effectively, then, the selection control circuit 24 may be configured to select the appropriate one of the sense resistors 20 based on the magnitude of the supply current $I_{PA}$. Variations to this general scheme might include combining two or more of the sense resistors 20 in parallel, extending the number of available resistor combinations.

The input filter 26 might be used where, for example, the amplitude information signal $AM_{IN}$ comes in as a digital bit stream. Oftentimes, so-called delta-sigma (ΔΣ) converters generate a high bit rate output signal comprising a varying number of 1's and 0's that may be averaged to generate a proportionate analog signal. In this case, the input filter 26 may simply comprise a low-pass filter, implemented, for example, using a resistor-capacitor network. Note that some implementations requiring $AM_{IN}$ filtering may move the filter 26 from the amplifier circuit 10 into the integrated circuit (not shown) responsible for $AM_{IN}$ generation.

Figure 7:
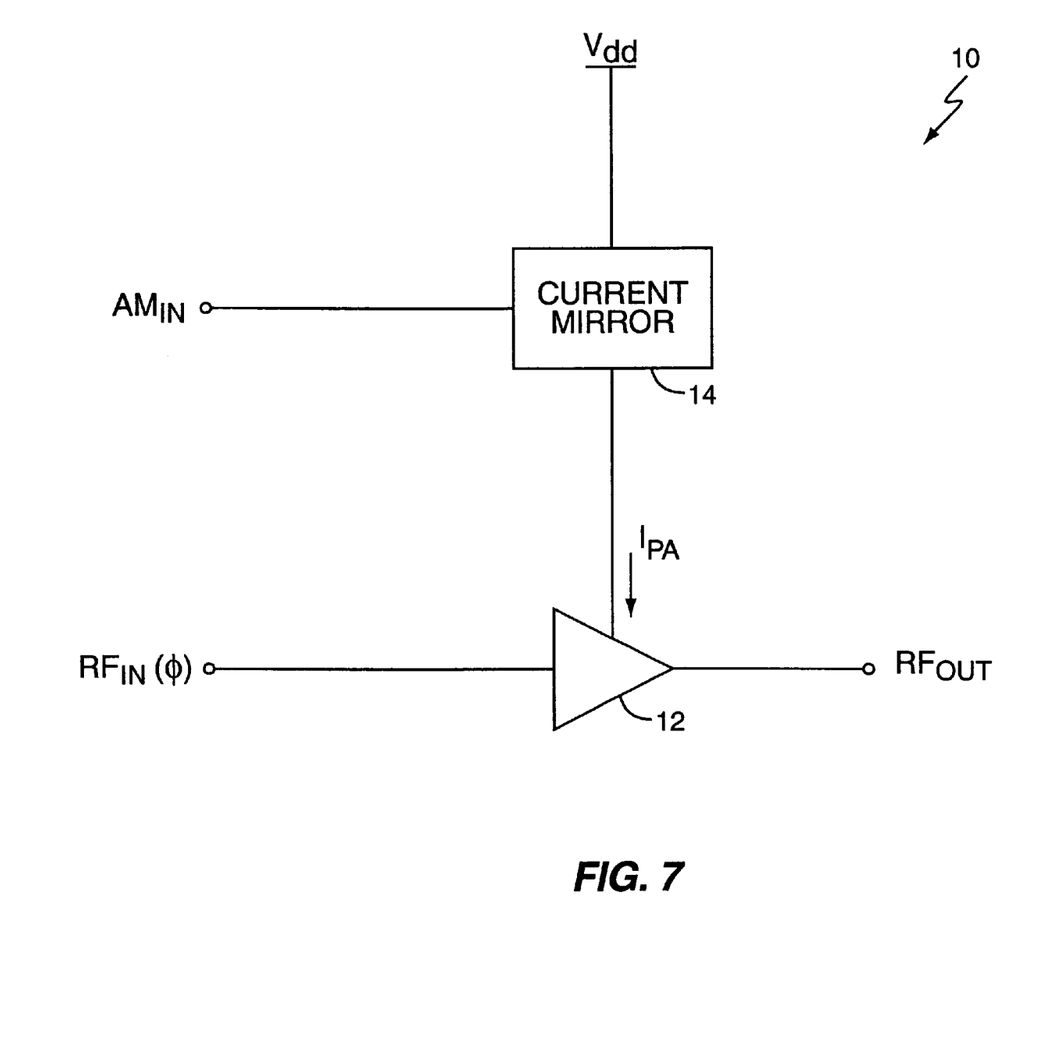
FIG. 7 is a diagram of a current-mirror implementation of the amplifier circuit of FIG. 2.

FIG. 7 is a general diagram of an alternative to the control circuit implementation illustrated in FIGS. 4 and 5. The current source 14 is based on a current mirror controlled in accordance with the amplitude information signal $AM_{IN}$. Specifically, the current source 14, configured as a current mirror, provides as its output the supply current $I_{PA}$ responsive to variations in the $AM_{IN}$ signal. This approach eliminates the need for amplifier current sensing via sense resistor 20.

Figure 8:
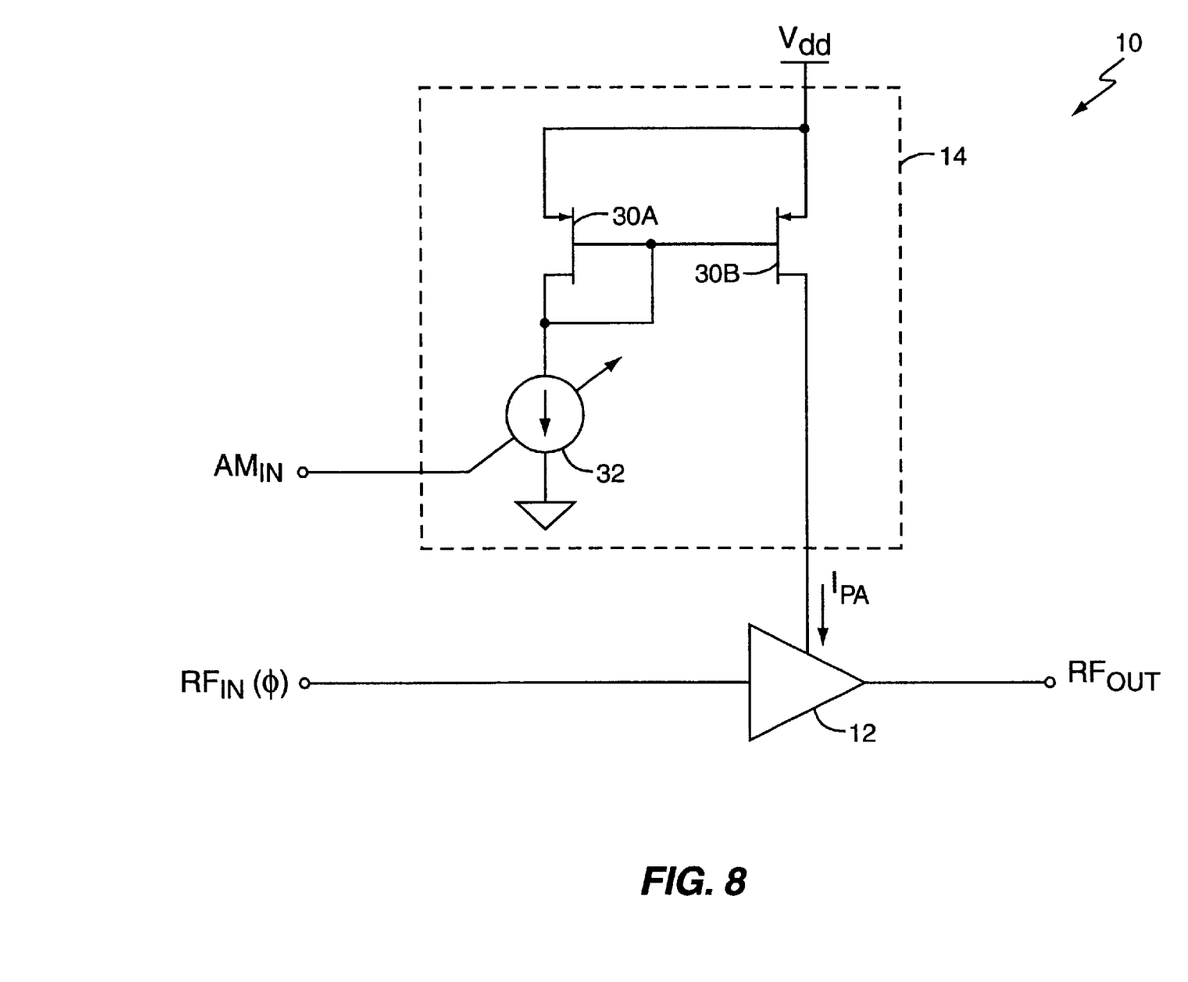
FIG. 8 is a diagram of an exemplary implementation of the current mirror of FIG. 7.

As is understood in the art, many variations exist for current mirror implementations. FIG. 8 illustrates an exemplary current mirror implementation for the current source 14. In this implementation, the current source 14 comprises transistors 30A and 30B, and a control current source 32. The transistor 30A defines a control current path, with the value of the control current set by the control current source 32 in accordance with the amplitude information signal $AM_{IN}$. The second transistor 30B has its base coupled to the base/drain terminals of the first transistor 30A, such that the supply current $I_{PA}$ provided by the second transistor 30B varies as a function of the $AM_{IN}$ signal. Essentially, the $AM_{IN}$ signal serves as the control current, and the supply current $I_{PA}$ is generated in proportion to the $AM_{IN}$ signal. The $AM_{IN}$ signal may be generated as a current mode signal and used to directly control the current through the first transistor 30A. This might obviate the need for the control current source 32.

In general, the first and second transistors 30A and 30B are implemented as a "matched pair." One approach to matching the transistors 30A and 30B is based on implementing them within the same integrated device, typically in close proximity to one another on the device die. By co-locating the transistors 30A and 30B, they enjoy close thermal coupling and are less likely to experience semiconductor process variations with respect to one another. The geometry of the transistors 30A and 30B may be scaled with respect to each other to achieve a desired current gain. The current gain sets the magnitude of the supply current $I_{PA}$ with respect to the magnitude of the control current, which is set in proportion to the $AM_{IN}$ signal.

Figure 9:
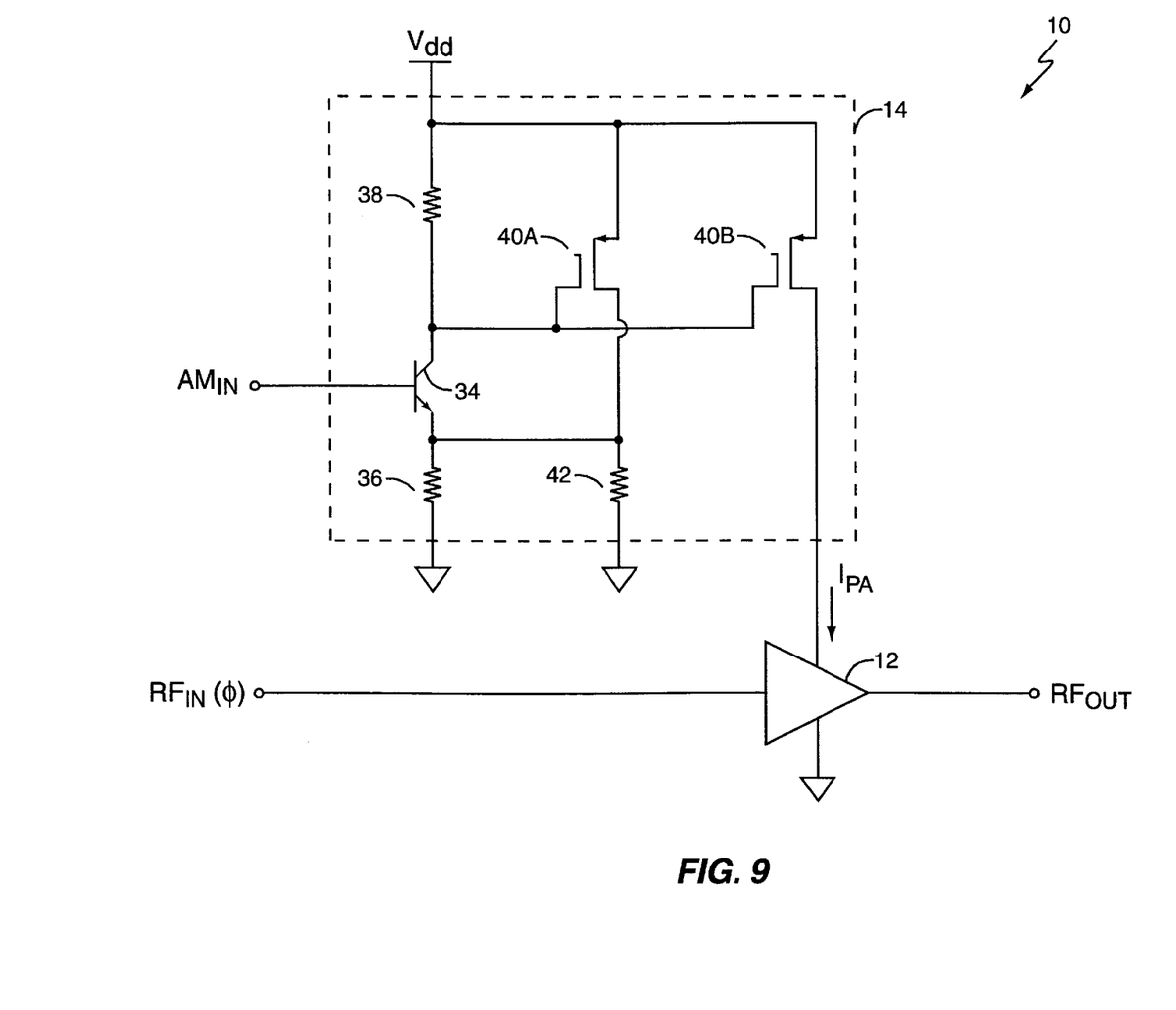
FIG. 9 is a diagram of an alternate exemplary implementation for the current mirror of FIG. 7.

FIG. 9 illustrates an alternate exemplary approach to a current mirror implementation of the current source 14. The illustrated circuit offers an advantageous approach to current amplitude modulation and minimizes many of the bandwidth considerations discussed in the context of FIGS. 4 and 5. In this implementation, the current source 14 comprises an input transistor 34 with an emitter degeneration resistor 36, a collector resistor 38, matched current mirror transistors 40A and 40B, and a fixed reference resistor 42. As illustrated, the input transistor 34 is a bipolar junction transistor (BJT), while transistors 40A and 40B are matched P-channel field-effect transistors (PFETs), however other transistor device types may be used in accordance with specific design needs.

The basis of operation is to develop a current through the fixed reference resistor 42 that is modulated as a function of the signal $AM_{IN}$, and then mirror that current into the power amplifier 12. In more detail, the signal $AM_{IN}$ drives the input transistor 34, which sinks a collector current proportional to $AM_{IN}$ through its collector load resistor 38. The voltage signal developed on the collector of transistor 34 drives the gates of matched transistors 40A and 40B. The transistor 40A sources current into the fixed reference resistor 42, the voltage across which is fed back to emitter of the transistor 34 to maintain its linear operation with respect to the $AM_{IN}$ signal. Thus, a voltage proportional to the signal $AM_{IN}$ is developed across the fixed reference resistor 42, the current through which is mirrored by the transistor 40B in the power amplifier 12.

The relative geometries of the matched transistor 40A and 40B may be set to achieve the desired scaling between the current through the fixed reference resistor 42 and the mirrored current ($I_{PA}$) into the power amplifier 12. Typically, the fixed reference resistor 42 has a value scaled to the nominal impedance of the power amplifier 12 at full rated power. This translates into a typical value of, for example, five Ohms.

The current source 14 illustrated in FIG. 9 may be particularly advantageous where the bandwidth of the amplitude modulation signal $AM_{IN}$ is high. For example, the amplitude modulation information of the $AM_{IN}$ signal may be in the range of 1.25 MHz to 1.5 MHz for GSM/EDGE applications, and may have similar bandwidth for other higher data rate third-generation (3G) wireless communication standards.

Of course, the current mirror implementation of the current source 14 shown in the various illustrations and discussed above may be extended to include various compensation circuits. While not shown, techniques for current mirror temperature compensation are well understood and may, if necessary, be employed in the current source 14. Further, other practical compensation measures may be included, such as AC compensation where needed, although this additional compensation is not illustrated.

Figure 10:
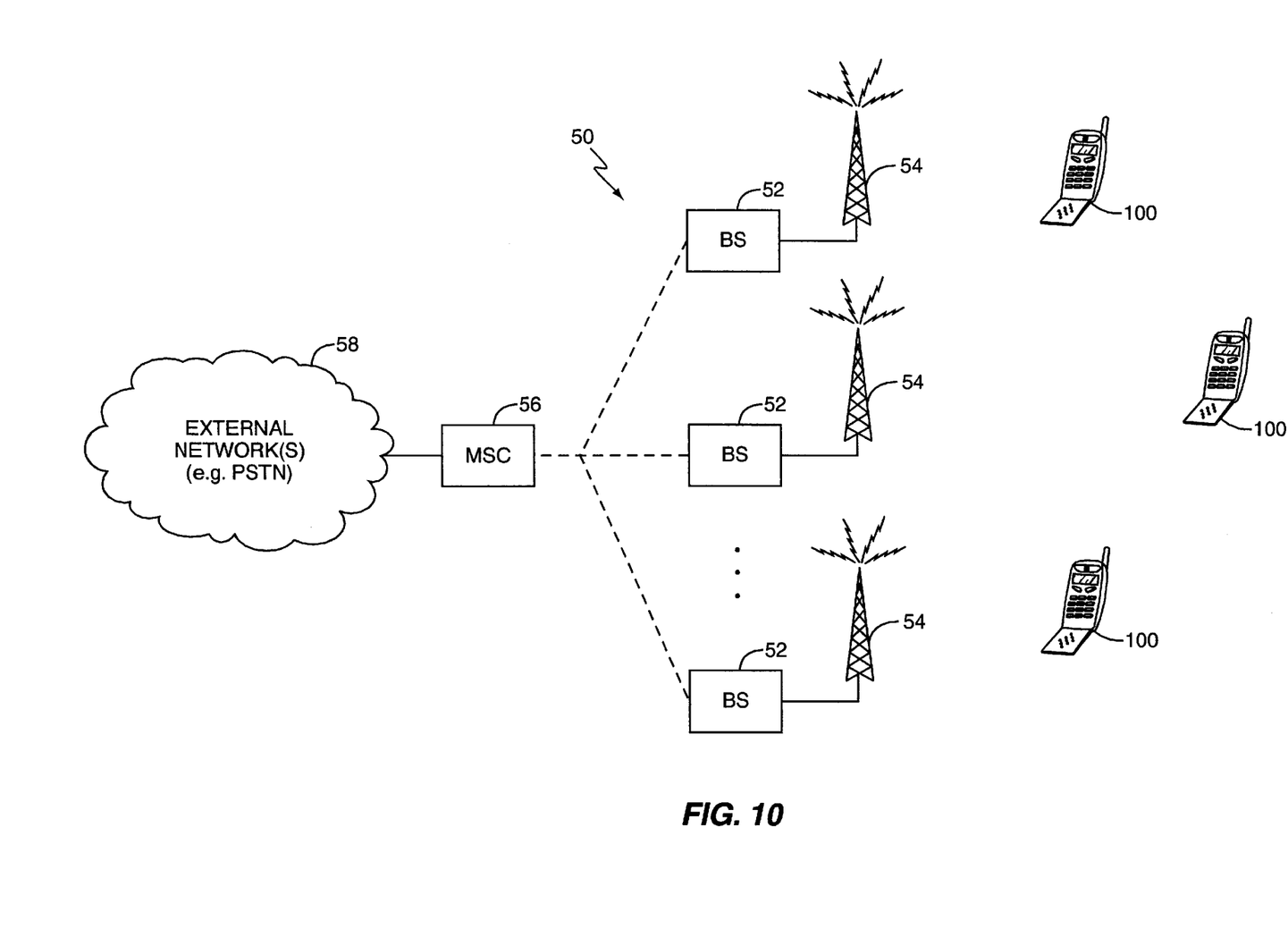
FIG. 10 is a diagram of an exemplary wireless mobile network.

FIG. 10 is a diagram of an exemplary mobile network supporting wireless communications. The mobile network is generally referred to by the numeral 50, and includes one or more base stations 52, each with an associated receive/transmit antenna 54, one or more mobile switching centers (MSCs) 56 interfacing the base stations 52 with one or more external networks 58, and a plurality of mobile terminals 100. The mobile terminals 100 and, in some implementations, the base stations 52, may advantageously incorporate the amplifier circuit 10 introduced in FIG. 2.

Wireless signaling between the mobile terminals 100 and the base stations 52 support communications between the mobile terminal users and users of the external networks 58, as well as with other mobile terminal users. Each base station supports communication and control traffic for mobile terminals 100 within the coverage area of its associated antenna 54. In turn, the MSC 56 coordinates and controls the functions of each base station 52, as well as interfacing communications traffic between the various base stations 52 and the external networks 58. The external networks 58 may include but are not limited to the Public Switched Telephone Network (PSTN), the Internet, and various Integrated Services Digital Networks (ISDN).

Figure 11:
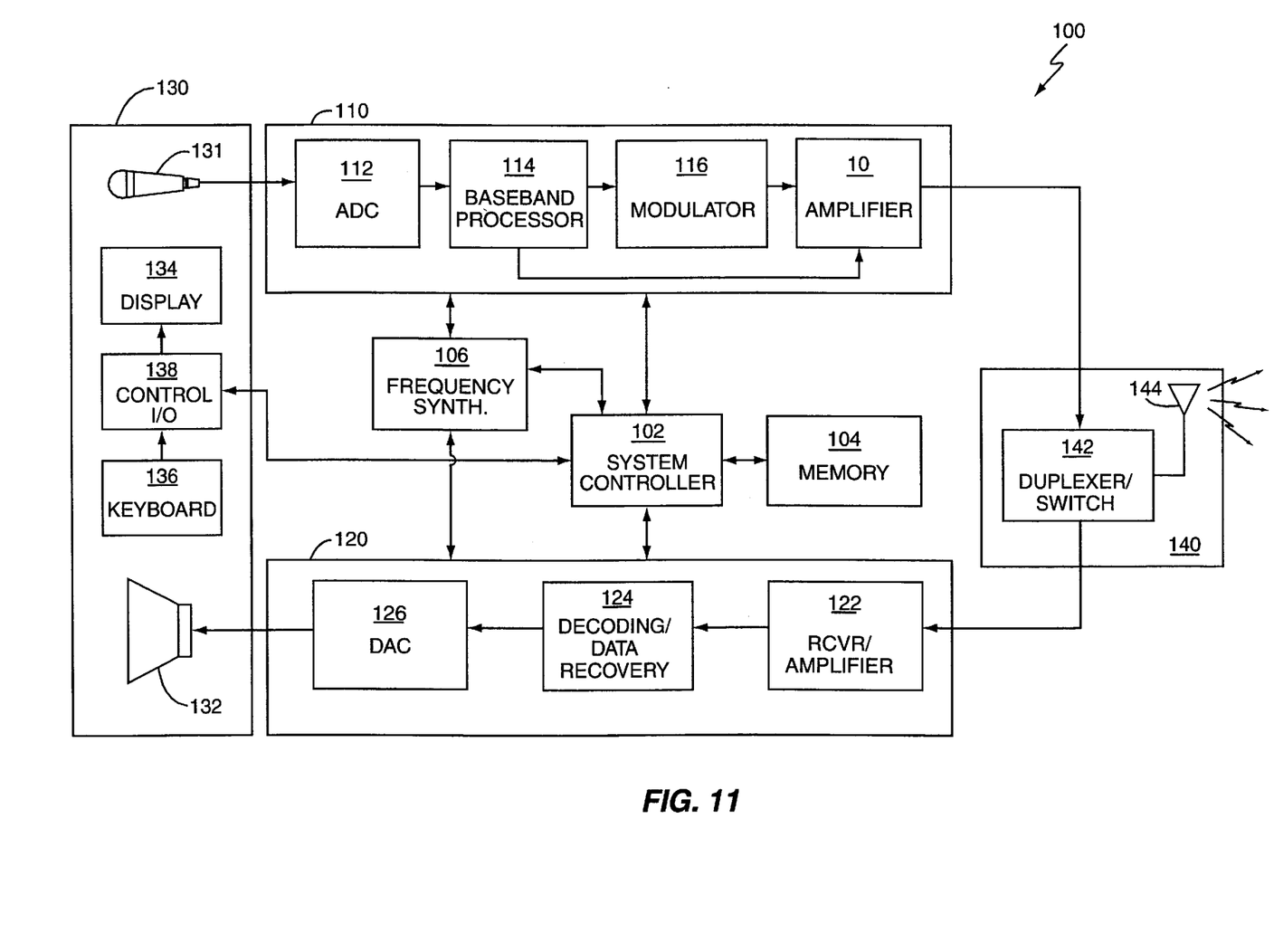
FIG. 11 is a diagram of a mobile terminal for use in the mobile network of FIG. 8.

FIG. 11 is a diagram of an exemplary implementation of the mobile terminal 100 used in the mobile network 50. The mobile terminal 100 includes a system controller 102, memory 104, a frequency synthesizer 106, a transmitter 110, a receiver 120, a user interface 130, and an antenna assembly 140.

In operation, the mobile terminal 100 sends and receives information via radio frequency signaling between it and its supporting base station 52. The system controller 102 is typically implemented as one or more microcontrollers (MCUs) that manage the user interface 130, and provide overall control of the mobile terminal 100. The memory 104 generally includes application software, default values for constants used in operation, and working space for data.

The user interacts with the mobile terminal 100 via the user interface 130. A microphone 131 converts user speech signals into a corresponding analog signal, which is provided to the transmitter 110 for subsequent conversion, processing, and transmission to the base station 52 via the antenna assembly 18. The receiver 120 receives signals from the base station 52 and extracts received audio information, e.g., speech from a remote user, and provides a resulting audio signal for driving a speaker 132 included in the user interface 130. The user interface 130 further includes a display 134 for providing visual information to the user, and a keypad 136 for accepting commands and data input from the user. The user interface 130 may include an I/O interface 138 for interfacing the display 134 and keypad 136 to the MCU 102. In short, the user interface 130 allows the user to send and receive speech and other audio information, to dial numbers, and to enter other data as needed.

The receiver 120 includes a receiver/amplifier 122, a decoding/data recovery module 124, and a digital-to-analog converter (DAC) 126. In operation, signals are received via the antenna 144, with the coupling circuit 142 providing signal isolation between received and transmitted signals. In some implementations, the coupling circuit 142 includes a receive/transmit switch to selectively connect either the transmitter 110 or the receiver 120 to the antenna 144. In other cases, the coupling circuit 142 includes a duplexer or other filter element to provide signal isolation during simultaneous receive and transmit operations.

Received signals are routed to the receiver amplifier 122, which provides conditioning, filtering, and down conversion of the received signal. In digital implementations, the receiver/amplifier 122 may use analog-to-digital converters (ADCs) to provide the decoding/data recovery module 124 with successive digital values corresponding to the incoming received signal. The decoding/data recovery module 124 recovers the audio information encoded in the received signal, and provides the DAC 126 with digital values corresponding to the received audio information. In turn, the DAC 126 provides an analog output signal suitable for driving the speaker 132.

The transmitter 110 is configured in accordance with the present invention and includes an analog-to-digital converter (ADC) 112, a baseband processor 114, a modulator 116, and the amplifier circuit 10 introduced earlier. In operation, the ADC 112 converts analog speech signals from the microphone 131 to corresponding digital values. The baseband processor 114 processes and encodes these digital values, providing error correction encoding and translation into a format suitable for the modulator 116. The baseband processor 114 may receive additional data for transmission from the system controller 102.

Depending upon the air interface standard used by the mobile terminal 100, the modulation scheme may require both amplitude and phase modulation of the transmit signal, denoted earlier as $RF_{OUT}$, radiated by the antenna 144. The baseband processor 114 typically encodes desired transmit information as a sequence of transmit symbols, with each symbol having a unique pairing of phase and amplitude values. The baseband processor 114 may split the phase and amplitude information into separate signals. Thus, it might generate a phase information signal, referred to as $\phi_{IN}$, synchronously with the amplitude information signal $AM_{IN}$, discussed earlier.

The modulator 116 uses the phase information signal $\phi_{IN}$ to modulate a carrier frequency signal, thus generating a carrier frequency signal having the desired phase modulation information. This modulated carrier frequency signal may serve as the RF input signal $RF_{IN}$ to the amplifier circuit 10. Note that the frequency synthesizer 106 may be used to generate a reference or carrier frequency signal for input to the modulator 116.

Thus, in this exemplary configuration, the amplifier circuit 10 receives the $RF_{IN}$ signal from the modulator 116 and the amplitude information signal $AM_{IN}$ from the baseband processor 114. The amplifier circuit 10 may be configured in accordance with any of the variations discussed earlier. The transmitter 110, using the power amplifier supply current modulation techniques available with the current source 14 included in the amplifier circuit 10, is able to impart highly linear amplitude modulation to the transmit signal ($RF_{OUT}$), which is radiated by the mobile terminal 100 via its antenna 144.

The present invention may, of course, be carried out in other specific ways than those herein set forth with departing from the scope and essential characteristics of the invention. Indeed, the present invention presents a generalized way to substantially prevent phase shift changes in a transmitted signal arising from changing transmitter configurations. These configuration changes may arise from the need to operate in different transmit signal power ranges, or from the need to make other types of changes in transmit signal generation. The present embodiments are therefore to be construed in all aspects as illustrative and not restrictive, and all changes coming within the meaning and equivalency of the appended claims are intended to be embraced herein.

What is claimed is:

1. A power amplifier circuit comprising:
   a power amplifier biased for saturated mode operation to generate an RF output signal by amplifying a constant-envelope RF input signal; and
   a current source responsive to an amplitude information signal to modulate a supply current of said power amplifier to impart desired amplitude modulation to said RF output signal.

2. The power amplifier circuit of claim 1 wherein said current source comprises a closed-loop control circuit to linearly vary said supply current responsive to said amplitude information signal.

3. The power amplifier circuit of claim 2 wherein said closed-loop control circuit comprises:
   a current sensor to generate a feedback signal proportional to said supply current of said power amplifier;
   a pass transistor responsive to a control signal to control said supply current of said power amplifier; and
   a control amplifier circuit to generate said control signal responsive to said feedback signal and said amplitude information signal.

4. The power amplifier circuit of claim 3 wherein said control amplifier circuit comprises an operational amplifier, said operational amplifier comprising:
   a first input to receive said feedback signal;
   a second input to receive said amplitude information signal; and
   an output to provide said control signal used to control said pass transistor.

5. The power amplifier circuit of claim 4 wherein said first input comprises an inverting input of said operational amplifier, such that said feedback signal operates as a negative feedback signal to said operational amplifier.

6. The power amplifier circuit of claim 3 wherein said current sensor comprises a resistor disposed in series in a supply current path carrying said supply current of said power amplifier.

7. The power amplifier circuit of claim 3 further comprising:
   at least two sense resistors; and
   a switch circuit responsive to a selection signal to selectively switch a selected one of said at least two sense resistors into a supply current path carrying said supply current of said power amplifier.

8. The power amplifier circuit of claim 7 further comprising selection logic to generate said selection signal based on a magnitude of said supply current of said power amplifier.

9. The power amplifier circuit of claim 3 wherein said pass transistor comprises a field-effect transistor (FET) device disposed in a supply current path carrying said supply current of said power amplifier.

10. The power amplifier circuit of claim 3 wherein said control amplifier circuit comprises an operational amplifier linearly responsive to said amplitude information signal.

11. The power amplifier circuit of claim 3 further comprising a feedback signal amplifier disposed in a feedback loop of said control amplifier to provide amplification of said feedback signal.

12. The power amplifier circuit of claim 11 wherein said feedback signal amplifier comprises an operational amplifier.

13. The power amplifier circuit of claim 1 wherein said current source comprises a current mirror to control said supply current of said power amplifier responsive to said amplitude information signal.

14. The power amplifier circuit of claim 13 wherein said current mirror comprises:
   a first transistor circuit to generate a control current responsive to said amplitude information signal; and
   a second transistor circuit coupled to said first transistor circuit and disposed in a supply path of said power amplifier to control said supply current of said power amplifier proportionate to said control current.

15. The power amplifier circuit of claim 13 wherein said current mirror comprises first and second matched transistor circuits with matched device geometries, wherein a scaling between said matched device geometries determines a current gain between said control current and said supply current.

16. The power amplifier circuit of claim 13 wherein said current mirror comprises:
a first field effect transistor (FET) device to carry a control current set by said amplitude information signal; and
a second FET device disposed in a supply path carrying said supply current and coupled to said first FET device to control said supply current of said power amplifier in proportion to said control current.

17. The power amplifier circuit of claim 13 wherein said current mirror comprises:
a first bipolar junction transistor (BJT) device to carry a control current set by said amplitude information signal; and
a second BJT device disposed in a supply path carrying said supply current and coupled to said first BJT device to control said supply current of said power amplifier in proportion to said control current.

18. The power amplifier circuit of claim 13 wherein said current mirror comprises:
an input circuit to generate a control voltage signal proportional to said amplitude information signal;
a reference current circuit to generate a reference current into a reference load responsive to said control voltage signal, said reference load providing a feedback voltage signal to said input circuit to maintain proportionality between said amplitude information signal and said reference current; and
an output current circuit to control said supply current to said power amplifier proportional to said reference current into said reference load.

19. The power amplifier circuit of claim 18 wherein said input circuit comprises a bipolar transistor comprising a base terminal coupled to said amplitude information signal, a collector terminal coupled to a supply voltage through a collector resistor, and an emitter terminal coupled to a signal ground through an emitter degeneration resistor, said emitter terminal further coupled to said feedback voltage signal from said reference load.

20. The power amplifier circuit of claim 18 wherein said reference current circuit comprises a first field-effect transistor comprising a gate terminal coupled to said control voltage signal, a source terminal coupled to a supply voltage, and a drain terminal coupled to said reference load to provide said reference current proportional to said control voltage signal to said reference load.

21. The power amplifier circuit of claim 20 wherein said output current circuit comprises a second field-effect transistor matched to said first field-effect transistor and comprising a gate terminal coupled to said control voltage signal, a source terminal coupled to said supply voltage, and a drain terminal to provide said supply current to said power amplifier proportional to said reference current into said reference load.

22. The power amplifier circuit of claim 1 wherein said power amplifier comprises a heterojunction bipolar transistor (HBT) device.

23. The power amplifier circuit of claim 1 wherein said power amplifier circuit comprises a portion of a RF transmitter in a mobile terminal for use in a wireless communication network.

24. The power amplifier circuit of claim 1 wherein said power amplifier circuit comprises a portion of a base station transmitter used in a base station forming part of a wireless communication network.

25. A RF transmitter comprising:
a baseband processor to generate a phase information signal and an amplitude information signal;
a modulator responsive to said phase information signal to generate a phase-modulated signal with a constant envelope;
a power amplifier circuit responsive to said phase-modulated signal to generate said RF output signal, said power amplifier circuit comprising:
a power amplifier biased for saturated mode operation to generate said RF output signal by amplifying said phase-modulated signal; and
a current source responsive to said amplitude information signal to modulate a supply current of said power amplifier to impart desired amplitude modulation to said RF output signal.

26. The RF transmitter of claim 25 wherein said current source comprises a closed-loop control circuit to linearly vary said supply current responsive to said amplitude information signal.

27. The RF transmitter of claim 26 wherein said closed-loop control circuit comprises:
a current sensor to generate a feedback signal proportional to said supply current of said power amplifier;
a pass transistor responsive to a control signal to control said supply current of said power amplifier; and
a control amplifier circuit to generate said control signal responsive to said feedback signal and said amplitude information signal.

28. The RF transmitter of claim 27 wherein said control amplifier circuit comprises an operational amplifier, said operational amplifier comprising:
a first input to receive said feedback signal;
a second input to receive said amplitude information signal; and
an output to provide said control signal used to control said pass transistor.

29. The RF transmitter of claim 28 wherein said control amplifier circuit comprises a second amplifier disposed in a feedback loop of said operational amplifier to amplify said feedback signal.

30. The RF transmitter of claim 28 wherein said first input comprises an inverting input of said operational amplifier, such that said feedback signal operates as a negative feedback signal to said operational amplifier.

31. The RF transmitter of claim 27 wherein said current sensor comprises a resistor disposed in series in a supply current path carrying said supply current of said power amplifier.

32. The RF transmitter of claim 27 further comprising:
at least two sense resistors; and
a switch circuit responsive to a selection signal to selectively switch a selected one of said two sense resistors into a supply current path carrying said supply current of said power amplifier.

33. The RF transmitter of claim 32 further comprising selection logic to generate said selection signal based on a magnitude of said supply current of said power amplifier.

34. The RF transmitter of claim 27 wherein said pass transistor comprises a field-effect transistor (FET) device disposed in a supply current path carrying said supply current of said power amplifier.

35. The RF transmitter of claim 27 wherein said control amplifier circuit of said closed-loop control circuit comprises an operational amplifier linearly responsive to said amplitude information signal.

36. The RF transmitter of claim 25 wherein said current source comprises a current mirror to control said supply current of said power amplifier responsive to said amplitude information signal.

37. The RF transmitter of claim 36 wherein said current mirror comprises:
a first transistor circuit to generate a control current responsive to said amplitude information signal; and
a second transistor circuit coupled to said first transistor circuit and disposed in a supply path of said power amplifier to control said supply current of said power amplifier proportionate to said control current.

38. The RF transmitter of claim 36 wherein said current mirror comprises first and second matched transistor circuits with matched device geometries, wherein a scaling between said matched device geometries determines a current gain between said control current and said supply current.

39. The RF transmitter of claim 36 wherein said current mirror comprises:
a first field effect transistor (FET) device to carry a control current set by said amplitude information signal; and
a second FET device disposed in a supply path carrying said supply current and coupled to said first FET device to control said supply current of said power amplifier in proportion to said control current.

40. The RF transmitter of claim 36 wherein said current mirror comprises:
a first bipolar junction transistor (BJT) device to carry a control current set by said amplitude information signal; and
a second BJT device disposed in a supply path carrying said supply current and coupled to said first BJT device to control said supply current of said power amplifier in proportion to said control current.

41. The RF transmitter of claim 36 wherein said current mirror comprises:
an input circuit to generate a control voltage signal proportional to said amplitude information signal;
a reference current circuit to generate a reference current into a reference load responsive to said control voltage signal, said reference load providing a feedback voltage signal to said input circuit to maintain proportionality between said amplitude information signal and said reference current; and
an output current circuit to control said supply current to said power amplifier proportional to said reference current into said reference load.

42. The RF transmitter of claim 25 wherein said RF transmitter comprises a portion of a mobile terminal used in a wireless communication network.

43. The RF transmitter of claim 42 wherein said baseband processor comprises digital signal processor to generate said phase and amplitude information signals based on input data and a predetermined modulation scheme.

44. The RF transmitter of claim 43 wherein said mobile terminal further comprises a user interface, said user interface comprising a microphone to generate an audio input signal.

45. The RF transmitter of claim 42 further comprising an analog-to-digital converter to generate at least a portion of said input data to said digital signal processor based on digitizing said audio input signal.

46. A method of modulating a transmit signal, the method comprising:
amplifying a constant-envelope signal with a power amplifier operating in a saturated mode to generate a transmit signal, said power amplifier having a supply current provided by a variable current source; and
varying said supply current provided by said current source to said power amplifier in response to an amplitude information signal to modulate the amplitude of said transmit signal.

47. The method of claim 46 wherein varying said supply current provided by said current source to said power amplifier in response to an amplitude information signal to modulate the amplitude of said transmit signal comprises:
generating a control voltage based on a difference between said amplitude information signal and a feedback signal that is proportional to a magnitude of said supply current provided to said power amplifier; and
controlling a pass transistor with said control voltage, said pass transistor being disposed in a supply current path carrying said supply current of said power amplifier.

48. The method of claim 47 further comprising generating said feedback signal from a sense resistor disposed in series in said supply current path of said power amplifier.

49. The method of claim 48 further comprising amplifying said feedback signal from said sense resistor before using said feedback signal to generate said control voltage.

50. The method of claim 46 wherein varying said supply current provided by said current source to said power amplifier in response to an amplitude information signal to modulate the amplitude of said transmit signal comprises:
providing said supply current to said power amplifier via a current mirror; and
controlling said current mirror to set a magnitude of said supply current based on said amplitude information signal.

51. A method of generating a RF transmit signal with both phase and amplitude modulation, the method comprising:
generating baseband phase and amplitude information signals;
modulating a RF carrier signal with said phase information signal to generate a constant-envelope phase-modulated signal;
amplifying said constant-envelope phase-modulated signal with a power amplifier biased for saturated mode operation to generate a RF transmit signal with phase modulation corresponding to said phase information signal; and
modulating a supply current of said power amplifier based on said amplitude information signal to impart amplitude modulation to said RF transmit signal corresponding to said amplitude information signal.

52. The method of claim 51 wherein modulating a supply current of said power amplifier based on said amplitude information signal to impart amplitude modulation to said RF transmit signal corresponding to said amplitude information signal comprises:
generating said supply current using a variable current source; and
varying a magnitude of said supply current provided by said variable current source based on said amplitude information signal.

53. The method of claim 51 wherein varying a magnitude of said supply current provided by said variable current source based on said amplitude information signal comprises:

generating a control voltage based on a difference between said amplitude information signal and a feedback signal that is proportional to a magnitude of said supply current provided to said power amplifier; and controlling a pass transistor with said control voltage, said pass transistor being disposed in a supply current path carrying said supply current of said power amplifier.

54. The method of claim 53 further comprising generating said feedback signal from a sense resistor disposed in series in said supply current path of said power amplifier.

55. The method of claim 52 wherein varying a magnitude of said supply current provided by said variable current source based on said amplitude information signal comprises:

providing said supply current to said power amplifier via a current mirror; and controlling said current mirror to set a magnitude of said supply current based on said amplitude information signal.

56. The method of claim 55 wherein controlling said current mirror to set a magnitude of said supply current based on said amplitude information signal comprises varying said supply current based on controlling a reference current of said current mirror based on said amplitude information signal, the magnitude of said reference current determining the corresponding magnitude of said supply current.

57. The method of claim 51 wherein generating baseband phase and amplitude information signals comprises:

digitizing an audio input signal to create digitized audio samples;

encoding said digitized audio samples to create a sequence of transmit symbols having both phase and amplitude information;

generating said amplitude information signal based on said amplitude information of said sequence of transmit symbols; and generating said phase information signal based on said phase information of said sequence of transmit symbols, said phase information signal generated synchronous with said amplitude information signal.

58. The method of claim 51 wherein generating said amplitude information signal comprises:

generating said amplitude information signal as a digital signal corresponding to desired amplitude modulations; and converting said digital signal into an analog signal to form an analog version of said amplitude information signal.

59. The method of claim 58 wherein modulating a supply current of said power amplifier based on said amplitude information signal to impart amplitude modulation to said RF transmit signal corresponding to said amplitude information signal comprises modulating said supply current of said power amplifier based on said analog version of said amplitude information signal.

* * * * *